United States Patent [19]

Simcoe

[11] 4,296,335

[45] Oct. 20, 1981

[54] HIGH VOLTAGE STANDOFF MOS DRIVER CIRCUITRY

[75] Inventor: Robert J. Simcoe, Liverpool, N.Y.

[73] Assignee: General Electric Company, Schenectady, N.Y.

[21] Appl. No.: 53,300

[22] Filed: Jun. 29, 1979

[51] Int. Cl.³ .................... H01L 00/00; H02H 9/00
[52] U.S. Cl. .................. 307/200 B; 307/355; 307/584; 361/56; 361/117
[58] Field of Search ............. 307/200 B; 361/57, 56, 361/112, 117, 126

[56] References Cited

U.S. PATENT DOCUMENTS

| | | | |
|---|---|---|---|
| 3,508,084 | 4/1970 | Warner | |
| 3,636,385 | 1/1972 | Koepp | 361/56 |
| 3,676,742 | 7/1972 | Russell et al. | 361/117 |
| 3,712,995 | 1/1973 | Steudel | 361/56 |
| 4,061,928 | 12/1977 | Kessler | 307/200 B |
| 4,119,870 | 10/1978 | Zibert | 307/355 |

Primary Examiner—Harold A. Dixon
Attorney, Agent, or Firm—Marvin Snyder; James C. Davis

[57] ABSTRACT

MOS circuitry conducting constant current at high voltage comprises first, second and third depletion mode MOSFETs connected in a loop, with their gates joined at the junction of the second and third MOSFETs. A control circuit is coupled to the junction of the first and second MOSFETs. The drain of an enhancement mode fourth MOSFET is connected to the junction of the second and third MOSFETs while its source remains unconnected. With high voltage applied to the junction of the first and third MOSFETs, and with the control circuit essentially nonconductive, the fourth MOSFET experiences diode breakdown, thereby acting as a high voltage source which prevents gate oxide rupture on the first, second and third MOSFETs and causing the first and second MOSFETs to become nonconductive until the control circuit is again rendered conductive.

24 Claims, 3 Drawing Figures

U.S. Patent      Oct. 20, 1981      4,296,335
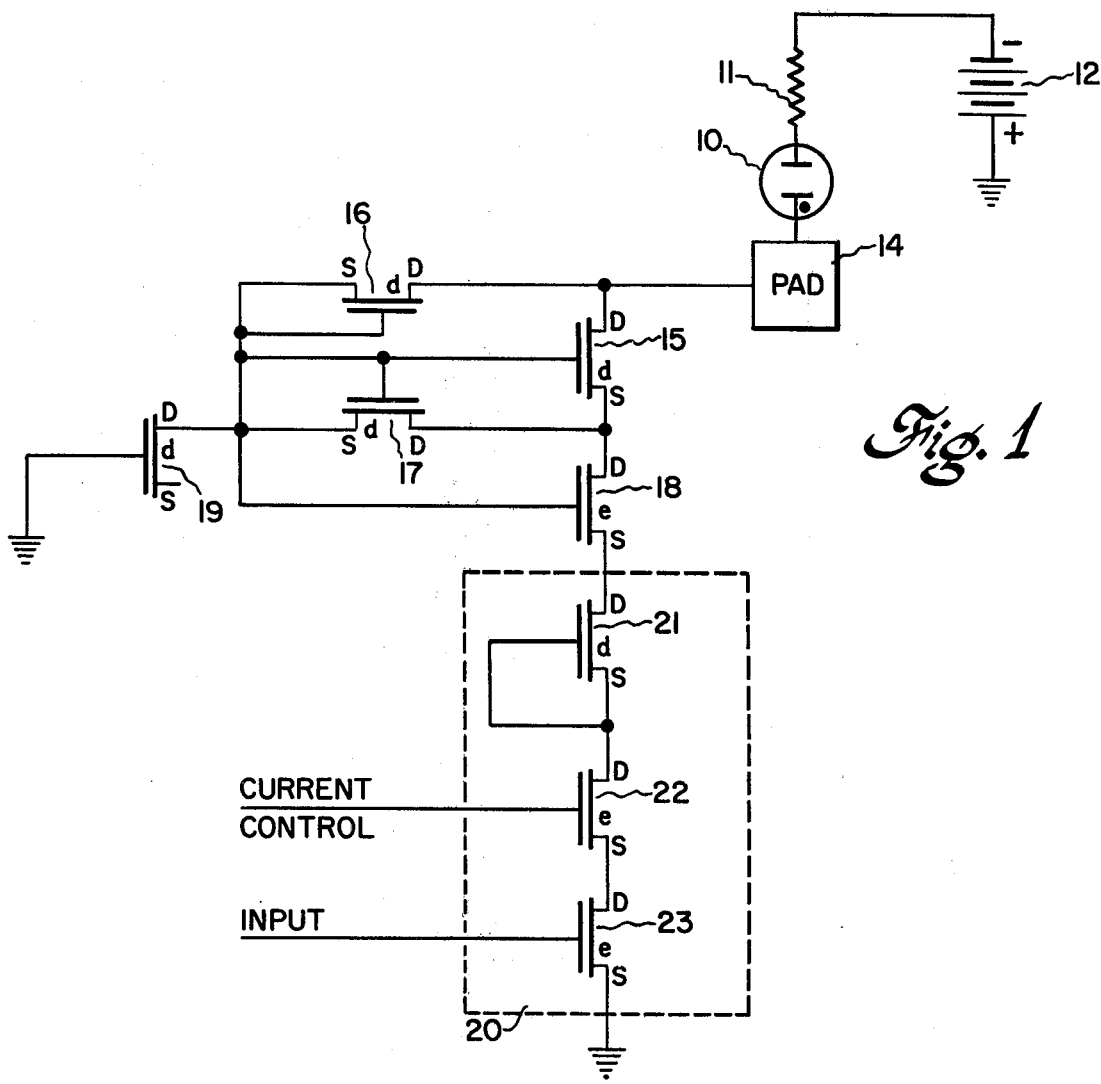
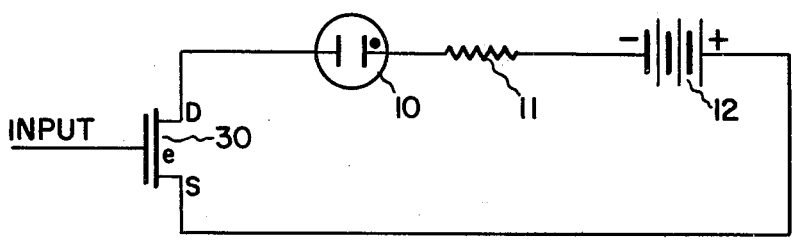
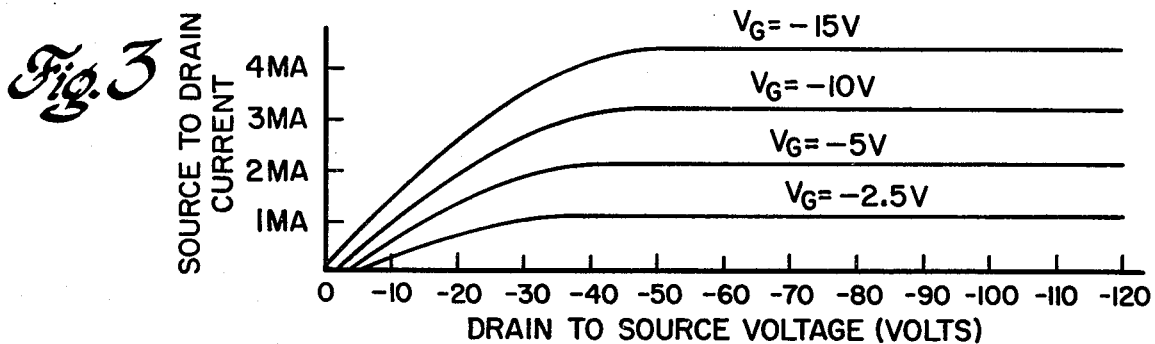

HIGH VOLTAGE STANDOFF MOS DRIVER CIRCUITRY

INTRODUCTION

This invention relates to metal-oxide-semiconductor (MOS) switching circuits with high voltage standoff capability, and more particularly to circuitry capable of driving high voltage low current devices directly with constant current from MOS large scale integrated circuits.

Many MOS large scale integrated circuits such as are employed in consumer goods, notably appliance controls, clocks, etc., require optically readable display devices to provide an output indication of circuit conditions. For ease in correctly reading these devices, it is desirable to employ relatively large displays that are brightly illuminated by use of indicating devices such as neon lamps, gas discharge devices, vacuum fluorescent tubes, or other high voltage low current devices. In the past, energization of such indicating devices, when used in conjunction with large scale integrated circuits, has required employment of external high voltage constant current drivers. To reduce cost as well as size of the electronic circuitry employed with such readout devices, it would be desirable to achieve high voltage interface with such readout devices directly to the MOS large scale integrated circuitry. The present invention attains this objective.

Accordingly, one object of the invention is to provide MOS circuitry capable of withstanding relatively high voltages and yet compatible with MOS large scale integrated circuits.

Another object is to provide relatively simple MOS large scale integrated circuits for driving high voltage, low current display devices directly with constant current and without need for high voltage external drivers.

Another object is to provide a metal-oxide-semiconductor field effect transistor (MOSFET) circuit capable of energizing high voltage low current display devices in response to signals supplied thereto, without rupturing the oxide layer on any of the MOSFETs.

Briefly, in accordance with a preferred embodiment of the invention, first, second and third MOSFETs are connected in a loop, the gates of each being connected to the junction of the second and third MOSFETs. A MOSFET control circuit is coupled to the junction of the first and second MOSFETs. An additional MOSFET having its gate grounded and its source terminal unconnected, has its drain terminal connected to the junction of the second and third MOSFETs so as to function as a diode. The conductive state of the control circuit determines whether constant current can flow through a high voltage low current load in series with a high voltage source and the junction of the first and second MOSFETs, thereby controlling actuation of the load.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing in which:

FIG. 1 is a schematic diagram of a circuit embodying the instant invention;

FIG. 2 is an equivalent circuit of the schematic diagram of FIG. 1; and

FIG. 3 is a family of curves plotted to illustrate the constant current function performed by the equivalent circuit of FIG. 2.

DESCRIPTION OF TYPICAL EMBODIMENTS

As illustrated in FIG. 1, a plurality of MOSFETs are connected to drive a load 10 requiring high voltage low current power. Load 10, which may typically comprise a neon lamp, a gas discharge device, a vacuum fluorescent tube, or any other high voltage low current device, is driven directly from the MOSFET circuitry, which is readily amenable to formation in large scale integration (LSI) integrated circuits. The circuit is connected in a manner that allows the pad voltage to attain a high value (i.e. the p-n junction breakdown voltage) without rupturing the gate oxide (not shown) of the MOSFETs. This is achieved by distributing the pad voltage across a series string of MOSFETs so that none of the MOSFETs in the string experiences a voltage in excess of its breakdown voltage.

Each of the MOSFETs shown in FIG. 1 is a p-channel device (i.e., PMOS), with the source electrode designated S and the drain electrode designated D. Three depletion mode (d) MOSFETs 15, 16 and 17 are connected in a loop, with their gate electrodes connected to the junction of the source electrodes of MOSFETs 16 and 17. The drain electrodes of MOSFETs 15 and 16 are connected to pad 14 to which load 10 is connected. Load 10 is energized from a relatively high negative voltage source 12 through a voltage dropping resistance 11. Resistance 11 is optional, if the instantaneous voltage can be withstood by the MOSFET circuit and load 10 in series; however, it is also useful in dissipating power which otherwise must be dissipated in the form of heat entirely in the LSI circuit.

The drain electrode of an enhancement mode (e) MOSFET 18 is connected to the source and drain junction of MOSFETs 15 and 17, respectively, while the source electrode of MOSFET 18 is connected to the source electrodes junction of MOSFETs 16 and 17 and to the drain electrode of an enhancement mode MOSFET 19. The gate electrode of MOSFET 19 is grounded, while the source electrode thereof is left unconnected, allowing MOSFET 19 to act as a field plate diode in the circuit.

Control means 20 preferably comprises three MOSFETs 21, 22 and 23, with the drain and source electrodes of enhancement mode MOSFET 22 connected to the source electrode of depletion mode MOSFET 21 and the drain electrode of enhancement mode MOSFET 23, respectively. The drain electrode of MOSFET 21 is connected to the source electrode of MOSFET 18, while the source electrode of MOSFET 23 is grounded. The gate electrode of MOSFET 21 is connected to the source electrode thereof, while the gate electrodes of MOSFETs 22 and 23 are adapted to receive input signals. In the presence of gate input signals applied thereto, MOSFET 22 can function as a current amplitude control gate and MOSFET 23 can function as a switch to render control means 20 conductive or nonconductive, thereby controlling energization of load 10.

In fabricating an integrated circuit of configuration shown in FIG. 1 using a PMOS process, the p-n junction breakdown occurs at approximately 100 volts, the gate oxide (i.e., the oxide separating the gate electrode from the semiconductor substrate of the MOSFET) ruptures at 75-100 volts, and the filed plate diode, which functions as a zener diode, clamps at 35-50 volts. MOSFET 15 is a relatively large device across which, in the circuit of FIG. 1, about half the voltage applied to its drain electrode appears, and is sized so that its current rating exceeds the constant current requirement of the load, while MOSFET 16 is relatively small and provides the current to sustain zener action on MOSFET 19 when MOSFET 17 is essentially nonconductive. Thus, with −100 volts on pad 14, current limiting resistance 11 being approximately 30,000 ohms, −15 volts on the gate electrode of MOSFET 22, and MOSFET 23 rendered conductive by a negative gate voltage at sufficient amplitude (e.g. −5 volts), control circuit 20 is conductive. At this juncture, voltage on the drain electrodes of MOSFETs 18 and 19 is approximately −50 volts, due to conduction of MOSFETs 15, 16 and 17, and voltage on the drain electrodes of MOSFETs 21, 22 and 23 is respectively, −48 volts, −15 volts, and −15 volts. MOSFET 19 functions as a zener diode with approximately −50 volts on its anode (i.e. drain) and, through conduction of MOSFET 17 when control circuit 20 is conductive, causes distribution of the pad voltage across the string of series-connected MOSFETs 15, 18, 21, 22 and 23. The voltage on each MOSFET in the apparatus of FIG. 1 is consequently within the limits imposed by the fabrication process.

MOSFET 22 acts as a current control gate that allows brightness of the lamp constituting load 10 to be set. This is useful when brightness of a plurality of lamps, such as used in plural segment displays, must be closely matched and their brightness controlled in unison. Since its gate voltage is normally negative, MOSFET 22 also helps distribute the pad voltage so that breakdown voltage levels are not reached in the circuit.

When MOSFETs 22 and 23 are conductive, MOSFET 21 functions as a constant current limiting device. This contributes the constant current characteristic of the circuit and, together with MOSFET 15, MOSFET 21 shares most of the voltage drop across the string of MOSFETs 15, 18, 21, 22 and 23. The current flow through MOSFET 19 is too small, in comparison to current flow through MOSFET 21, to have any significant adverse effect on the constant current characteristic of the apparatus.

When MOSFET 23 is rendered essentially nonconductive by reducing the negative gate voltage thereon almost to zero, conduction through MOSFET 18 and control means 20 essentially ceases. MOSFETs 16 and 17 then limit current flow to MOSFET 19, which continues to function as a zener diode with approximately −50 volts on its anode (i.e. drain). The series impedance presented to the drain electrode of MOSFET 19 by MOSFETs 15, 16 and 17, which is primarily determined by MOSFET 16 during nonconduction of MOSFET 23, is in the range of 10-100 megohms. Hence current which flows to sustain the zener action of MOSFET 19 connected as a field plate diode is on the order of tens of nanoamperes, which is insufficient to ignite, or sustain ignition of, a neon lamp.

Each time MOSFET 23 is initially rendered essentially nonconductive, voltage on the source electrode of MOSFET 15 becomes more negative, until the body effect (i.e. the effect on the threshold voltage of the device due to its source voltage being nonzero) renders MOSFET 15 essentially nonconductive. Those skilled in the art will appreciate that, for a p-channel depletion device such as MOSFET 15, the body effect voltage is approximately $-0.65\sqrt{\text{source voltage}}$ and adds to the threshold voltage; therefore, at sufficiently high source voltage the depletion device effectively becomes an enhancement device. For example, if the threshold voltage of the depletion device such as MOSFET 15 is +4.5 volts, the device changes to an enhancement device at a source voltage of approximately 50 volts, since $+4.5 - 0.65\sqrt{50}$ is approximately 0. Therefore, at a source voltage of approximately 50 volts, MOSFET 15 is on the verge of becoming nonconductive. Since the gate of MOSFET 18 is maintained at a negative voltage by the zener action of field plate diode 19, voltage applied to control means 20 from the source electrode of MOSFET 15 is buffered through MOSFET 18; that is, MOSFET 18 holds voltage on the drain electrode of MOSFET 21 to a level insufficient to allow the source-to-drain voltage of MOSFET 21 to reach breakdown voltage when the gate electrodes of MOSFETs 22 and 23 are at ground potential.

An equivalent circuit of the schematic diagram shown in FIG. 1 is illustrated in FIG. 2, and may be represented by a single enhancement mode MOSFET 30 in series with load 10, load resistor 11 and voltage source 12. The current-voltage characteristics of the single device, represented by the curves of FIG. 3, show that the device performs a constant current function when the drain-to-source voltage is greater than approximately 30 volts, for a 100 volt DC supply voltage.

The foregoing describes MOS circuitry capable of withstanding relatively high voltages and yet compatible with MOS large scale integrated circuits. The relatively simple circuitry enables MOS large scale integrated circuits to drive high voltage low current display devices directly with constant current, without need for high voltage external drivers. The circuitry employs MOSFETs so as to energize high voltage low current display devices in response to signals supplied to the MOS circuitry, and without rupturing the oxide layer on any of the MOSFETs.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

I claim:

1. A high voltage standoff circuit for driving high voltage low current display devices directly with constant current, said circuit being compatible with large scale integrated circuits, comprising:

first, second and third MOSFETs connected in a loop so as to form therein a junction of said first and second MOSFETs, a junction of said second and third MOSFETs, and a junction of said first and third MOSFETs, said first, second and third MOSFETs having their gates connected directly to each other in common with the junction of said second and third MOSFETs;

control means coupled to the junction of said first and second MOSFETs; and diode means coupled to said junction of said second and third MOSFETs, and circuit being adapted to support high voltage applied to the junction of said first and third MOSFETs.

2. The high voltage standoff circuit of claim 1 wherein said diode means comprises a MOSFET coupled to the junction of said second and third MOSFETs and having its source open-circuited.

3. The high voltage standoff circuit of claim 1 wherein said control means includes a fourth MOSFET having its gate adapted to receive an input signal for switching said control means between conductive and essentially nonconductive states.

4. The high voltage standoff circuit of claim 3 wherein said diode means comprises a MOSFET coupled to the junction of said second and third MOSFETs and having its source open-circuited.

5. The high voltage standoff circuit of claim 3 wherein said control means further includes a fifth MOSFET coupled in series with said fourth MOSFET and having its gate adapted to receive an input signal for controlling amplitude of source-to-drain current passing therethrough.

6. The high voltage standoff circuit of claim 5 wherein said diode means comprises a MOSFET coupled to the junction of said second and third MOSFETs and having its source open-circuited.

7. The high voltage standoff circuit of claim 5 including a buffer MOSFET coupling said control means to the junction of said first and second MOSFETs, the gate of said buffer MOSFET being coupled to the junction of said second and third MOSFETs.

8. The high voltage standoff circuit of claim 5 wherein said control means includes a current-limiting MOSFET coupled to the junction of said first and second MOSFETs.

9. The high voltage standoff circuit of claim 8 wherein the gate and source of said current-limiting MOSFET are interconnected.

10. The high voltage standoff circuit of claim 1 wherein said control means includes a current-limiting MOSFET coupled to the junction of said first and second MOSFETs.

11. The high voltage standoff circuit of claim 10 wherein said diode means comprises a MOSFET coupled to the junction of said second and third MOSFETs and having its source open-circuited.

12. The high voltage standoff circuit of claim 10 wherein the gate and source of said current-limiting MOSFET are interconnected.

13. The high voltage standoff circuit of claim 12 wherein said diode means comprises a MOSFET coupled to the junction of said second and third MOSFETs and having its source open-circuited.

14. The high voltage standoff circuit of claim 3 wherein said control means includes a current-limiting MOSFET coupled to the junction of said first and second MOSFETs.

15. The high voltage standoff circuit of claim 14 wherein the gate and source of said current-limiting MOSFET are interconnected.

16. The high voltage standoff circuit of claim 3 including a buffer MOSFET coupling said control means to the junction of said first and second MOSFETs, the gate of said buffer MOSFET being coupled to the junction of said second and third MOSFETs.

17. The high voltage standoff circuit of claim 16 wherein said control means includes a current-limiting MOSFET coupling said control means to the junction of said first and second MOSFETs.

18. The high voltage standoff circuit of claim 17 wherein the gate and source of said current-limiting MOSFET are interconnected.

19. The high voltage standoff circuit of claim 1 including a buffer MOSFET coupling said control means to the junction of said first and second MOSFETs, the gate of said buffer MOSFET being coupled to the junction of said second and third MOSFETs.

20. The high voltage standoff circuit of claim 19 wherein said diode means comprises a MOSFET coupled to the junction of said second and third MOSFETs and having its source open-circuited.

21. The high voltage standoff circuit of claim 20 wherein said control means includes a current-limiting MOSFET coupling said control means to the junction of said first and second MOSFETs.

22. The high voltage standoff circuit of claim 21 wherein the gate and source of said current-limiting MOSFET are interconnected.

23. The high voltage standoff circuit of claim 19 wherein said control means includes a current-limiting MOSFET coupling said control means to the junction of said first and second MOSFETs.

24. The high voltage standoff circuit of claim 23 wherein the gate and source of said current-limiting MOSFET are interconnected.

* * * * *